United States Patent
Young et al.

(10) Patent No.: US 7,368,751 B2
(45) Date of Patent: May 6, 2008

(54) METHOD OF MANUFACTURING AN ELECTRONIC DEVICE COMPRISING A THIN FILM TRANSISTOR

(75) Inventors: Nigel D. Young, Redhill (GB); Soo Y. Yoon, Kyunggi-do (KR); Ian D. French, Hove (GB); David J. McCulloch, Redhill (GB)

(73) Assignee: TPO Hong Kong Holding Limited, Shatin (HK)

( * ) Notice: Subject to any disclaimer, the term of this patent is extended or adjusted under 35 U.S.C. 154(b) by 0 days.

(21) Appl. No.: 10/529,117

(22) PCT Filed: Sep. 12, 2003

(86) PCT No.: PCT/IB03/03986

§ 371 (c)(1), (2), (4) Date: Mar. 24, 2005

(87) PCT Pub. No.: WO2004/030074

PCT Pub. Date: Apr. 8, 2004

(65) Prior Publication Data

US 2005/0282316 A1  Dec. 22, 2005

(30) Foreign Application Priority Data

Sep. 27, 2002 (GB) .................... 0222450.9

(51) Int. Cl.
*H01L 29/786* (2006.01)
*H01L 21/336* (2006.01)

(52) U.S. Cl. .............. 257/66; 438/162; 438/166; 257/E29.273; 257/E29.285

(58) Field of Classification Search .......... 438/166, 438/162, 164; 257/66, E29.273, E29.285, 257/E21.411, E21.415

See application file for complete search history.

(56) References Cited

U.S. PATENT DOCUMENTS

| | | | | |
|---|---|---|---|---|
| 4,692,344 A | * | 9/1987 | Kaganowicz et al. | ....... 438/762 |
| 5,250,444 A | * | 10/1993 | Khan et al. | ......... 438/162 |
| 5,288,645 A | * | 2/1994 | Toshima et al. | ....... 436/144 |
| 5,328,861 A | * | 7/1994 | Miyakawa | ......... 438/151 |
| 5,470,763 A | * | 11/1995 | Hamada | ......... 438/162 |
| 5,529,951 A | * | 6/1996 | Noguchi et al. | ......... 438/487 |
| 5,534,445 A | * | 7/1996 | Tran et al. | ......... 438/162 |
| 5,681,759 A | | 10/1997 | Zhang | |
| 5,946,561 A | | 8/1999 | Yamazaki et al. | |

(Continued)

OTHER PUBLICATIONS

Wolf et al., Silicon Processing for the VLSI Era, vol. 1-Process Technology, Sunset Beach, CA: Lattice Press, 1986, pp. 191-194.*

*Primary Examiner*—M. Wilczewski
(74) *Attorney, Agent, or Firm*—Birch, Stewart, Kolasch & Birch, LLP

(57) ABSTRACT

A method of manufacturing an electronic device comprising a thin film transistor (42), comprises forming a hydrogen-containing layer (22) over a semiconductor layer (10;20), irradiating the hydrogen-containing layer so as to hydrogenate the semiconductor layer, and then forming electrodes (24;26,28) over the semiconductor layer. A short diffusion length and direct path is provided for the hydrogen thus allowing rapid hydrogenation of the semiconductor layer using relatively few, high-fluence laser pulses. The supporting substrate (12) is not heated significantly making the method particularly useful for TFTs on polymer substrates. Crystallisation and hydrogenation of the semiconductor layer can be executed in the same irradiation step.

15 Claims, 7 Drawing Sheets

U.S. PATENT DOCUMENTS 6,124,154 A * 9/2000 Miyasaka .................. 438/151
6,709,906 B2 * 3/2004 Yamaguchi et al. ........ 438/162
6,881,615 B2 * 4/2005 Yamazaki et al. .......... 438/166

* cited by examiner

METHOD OF MANUFACTURING AN ELECTRONIC DEVICE COMPRISING A THIN FILM TRANSISTOR

BACKGROUND OF THE INVENTION

1. Field of the Invention

This invention relates to a method of manufacturing an electronic device comprising a thin film transistor.

2. Description of the Prior Art

Thin film transistors (TFTs) and their methods of manufacture are well known in the field of large area electronics. Applications include the use as switching elements in active matrix devices such as displays and image sensors for example, in which TFTs are arranged in a row and column array and are addressed by selection and data signals via sets of row and column address conductors respectively. There is much interest in improving the performance characteristics of TFTs in order to produce higher quality active matrix devices which can be addressed faster, have lower power consumption and are more reliable.

The semiconductor layer of a TFT is commonly formed from hydrogenated amorphous, polycrystalline or single-crystal silicon. The hydrogenation occurs at some stage during the manufacturing process and serves to electrically neutralise the semiconductor material. This improves the TFT's characteristics including higher carrier mobility, lower threshold voltage and lower leakage current.

Hydrogenation of TFTs is commonly achieved by heating the devices in hydrogen gas to temperatures around 250° C. or higher, or by exposure to atomic hydrogen in a plasma at 300° C. or higher. However, these temperatures are too high for use with substrates having low heat resistances such as polymer substrates for example.

US 2002/0004289-A1 discloses a method of manufacturing a TFT in which a hydrogen-containing film is formed over the TFT after electrodes are formed on the source and drain regions of the semiconductor layer. The hydrogen-containing film is irradiated with a pulsed laser beam causing the hydrogen to diffuse into the semiconductor layer. This is executed at a temperature lower than the heat-resistant temperature of the substrate.

However, in the method of US 2002/0004289-A1 the hydrogen must diffuse under the metal gate and along the length of the active channel region of the semiconductor material located between the source and drain regions in the case of a top-gated device, or under a silicon oxide film in the case of a bottom-gated device. In order for this to be achieved without heating the device to an excessive temperature, a large number of low power laser pulses are required. This reduces the throughput of the manufacturing process.

SUMMARY OF THE INVENTION

It is an object of the invention to provide an improved method of manufacturing a TFT.

It is another object of the invention to provide a simplified method of manufacturing a TFT in which the time required to hydrogenate the semiconductor layer is reduced.

According to the present invention there is provided a method of manufacturing an electronic device comprising a thin film transistor, the transistor comprising a gate electrode and source and drain electrodes, a semiconductor layer separated from the gate electrode by a gate insulator layer, the gate electrode being arranged to control current flow through a channel region of the semiconductor layer between the source and drain electrodes, the method comprising the steps of:

(a)—forming the semiconductor layer over a substrate;

(b)—forming a hydrogen-containing layer over the semiconductor layer;

(c)—irradiating the hydrogen-containing layer with an energy beam to hydrogenate at least part of the semiconductor layer, and then (d)—forming the gate electrode, and/or the source and drain electrodes over the semiconductor layer.

This method shortens the hydrogenation period thereby reducing the overall manufacturing time and cost. There is no intervening layer between the hydrogen-containing layer and the channel region which obstructs the diffusion path of the hydrogen during the hydrogenation period. Therefore, the diffusion length of the hydrogen is reduced and thus fewer energy beam pulses are required in order to diffuse the hydrogen into the channel region. Also, by forming the overlying gate electrode or source and drain electrodes after the hydrogenation step, they are not subjected to the heat created by the incident energy beam. This enables the use of a higher intensity energy beam for the hydrogenation and thus further reducing the number of required pulses.

In one embodiment a top-gate TFT is formed wherein the gate electrode is formed in step (d) and the gate insulator layer comprises the hydrogen-containing layer. Advantageously, the gate insulator layer may further comprise a second insulator layer formed directly on the semiconductor layer. This is preferably formed of a different material to the hydrogen-containing layer. The semiconductor layer may be patterned to form a semiconductor island and the gate insulator layer comprises a first region overlying the semiconductor island and a second region disposed laterally to one side of the semiconductor island, wherein the first region has a hydrogen content lower than that of the second region. Advantageously, by having at least part of the gate insulator layer serving also to provide a source of hydrogen, there is no need for a separate hydrogen-containing layer thus reducing the number of manufacturing steps. Preferably, the hydrogen-containing layer comprises silicon nitride ($SiN_x$) as this is naturally hydrogen-rich and contains less pin-hole defects at a given temperature than most conventionally used gate insulator layer materials such as silicon dioxide for example. Also, $SiN_x$ provides a better step coverage than silicon dioxide when depositing at lower temperatures.

Alternatively, the method may further comprise the steps of, (e)—removing the hydrogen-containing layer, and (f)—forming the gate insulator layer over the semiconductor layer before step (d). This provides a top-gate TFT having a gate insulator layer formed of a different, more favourable material to that of the hydrogen-containing layer.

In another embodiment, a bottom-gate TFT may be provided wherein the source and drain electrodes are formed in step (d), the method further comprising the step of, (g)—removing the hydrogen-containing layer before step (d).

The semiconductor layer may initially comprise amorphous silicon and wherein the method further comprises the step of irradiating the semiconductor layer with an energy beam to polycrystallise at least part of the semiconductor layer before step (c).

Alternatively, the semiconductor layer initially comprises amorphous silicon and the energy beam polycrystallises at least part of the semiconductor layer in step (c). Therefore, at least the channel region of the semiconductor layer is both polycrystallised and hydrogenated in a single irradiation step, and advantageously, the number of process steps is reduced.

Further scope of the applicability of the present invention will become apparent from the detailed description given hereinafter, However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

It should be appreciated that the figures are merely schematic and have not been drawn to scale, especially the thickness cross-section representations of the various layers. The same reference numbers are used throughout the figures to denote the same or similar parts.

DETAILED DESCRIPTION OF THE PREFERRED EMBODIMENTS

Thin film transistors (TFTs) according to the invention, and manufactured in accordance with the invention, can form the switching elements of active matrix devices. By way of example, the following description will refer to an AMLCD device.

The TFTs are arranged in a matrix array on a substrate forming an active plate addressed by orthogonal sets of row and column conductors. Known deposition and photolithographic patterning techniques are employed to form thin film layers of various conducting, insulating and semiconducting materials on the substrate. The manufacture of both top-gate and bottom-gate transistors will be described. Although the figures show the cross-section of just one transistor, it should be appreciated that an entire array of TFTs and address conductors are formed simultaneously on the same substrate.

Figure 1A:
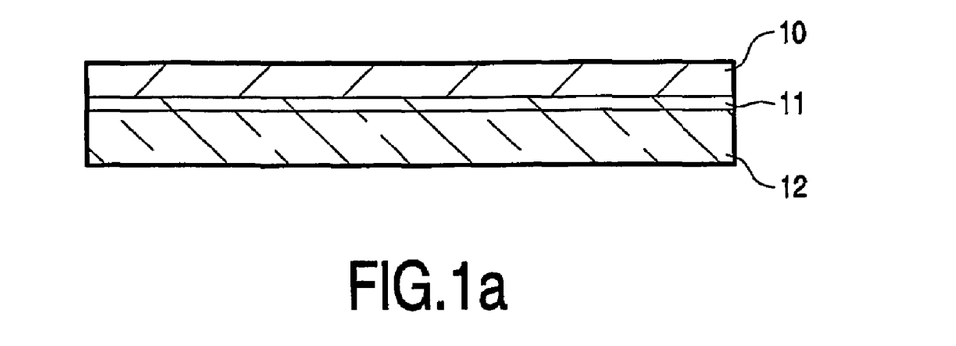
FIGS. 1a-1f show a cross-section of a TFT at various stages of manufacture according to a first embodiment of the invention.

The manufacture of a top-gate TFT in accordance with the invention will now be described with reference to FIGS. 1a to 1f. Firstly, a protective dielectric layer of silicon dioxide 11 is deposited by PECVD over a polymer substrate 12 to a thickness of around 500 nm. The polymer substrate 12 has a relatively low melting point compared to other materials used conventionally for AMLCD substrates such as glass. A layer of amorphous silicon (a-Si) 10 is then deposited over the dielectric 11 by low temperature plasma CVD for example as shown in FIG. 1a. The a-Si layer is approximately 40 nm in thickness and forms the switchable channel region of the TFT at a later stage.

Figure 1B:
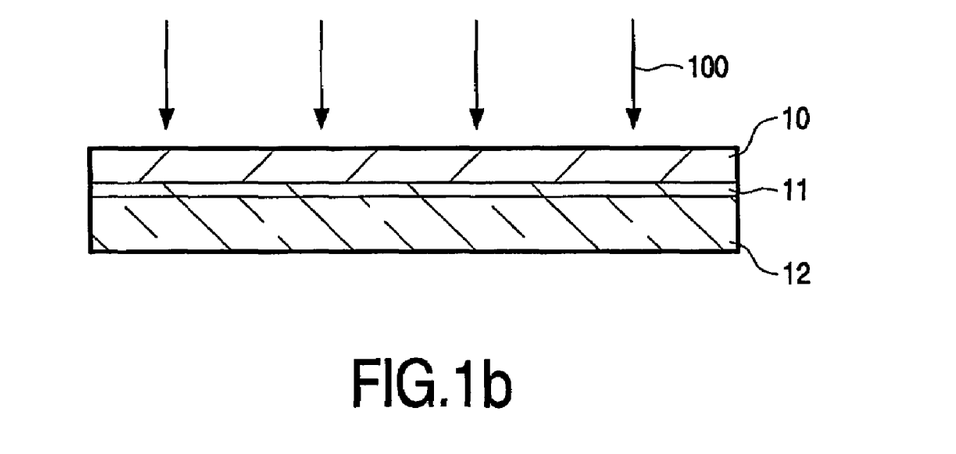

The a-Si layer 10 is then polycrystallised by irradiating the layer with pulses from an eximer laser 100 having a laser fluence in the range of 270-330 mJ/cm$^2$ as shown in FIG. 1b. The heating of the silicon layer 10 is not sufficient to melt or deform the underlying polymer substrate 12.

Figure 1C:
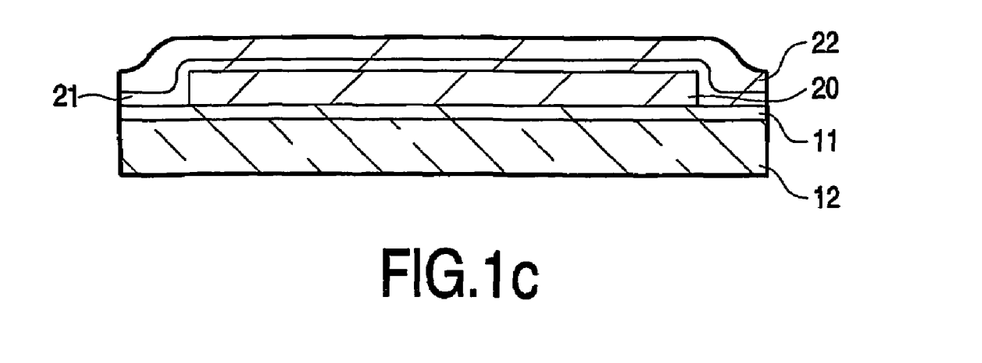

A wet or dry etch is then employed to pattern the polycrystalline silicon (or polysilicon) layer into an island 20 which is laterally spaced from other islands in the array also formed from this etch step. With reference to FIG. 1c, a thin layer of silicon dioxide 21 is then deposited over the entire substrate, and covering the polysilicon island 20, to a thickness in the range of 5-10 nm. Over this, a silicon nitride layer 22 having a thickness of approximately 10-100 nm is formed. The silicon oxide layer 21 and the silicon nitride layer 22 form the gate insulator layer of the final TFT device separating the channel region of the polysilicon island 20 from the overlying gate electrode.

The hydrogen content of the silicon nitride layer is approximately 10-20 atomic %. This provides the source of hydrogen for the hydrogenation of the underlying polysilicon island 20. The thin layer of silicon oxide 21 serves to stabilise the interface with the polysilicon island 20.

Figure 1D:
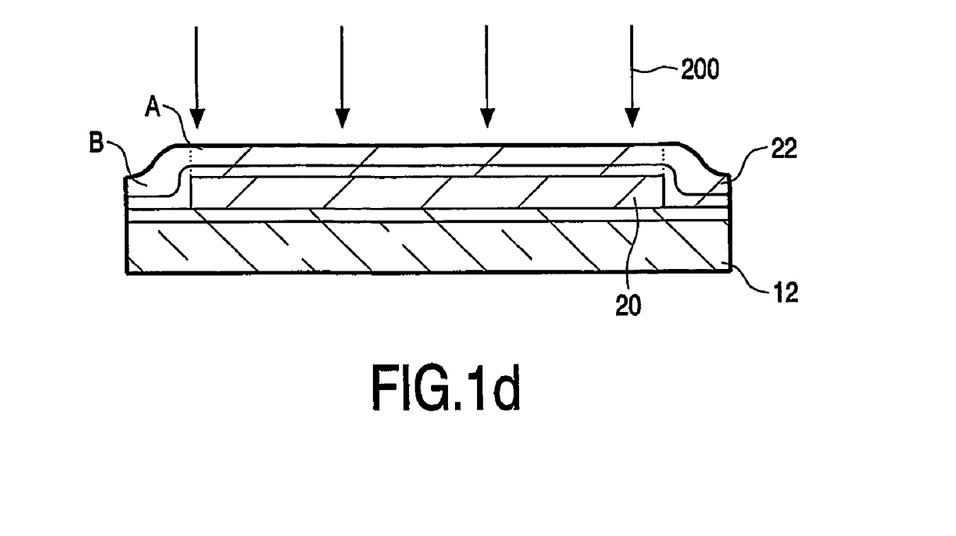

FIG. 1d shows the hydrogenation of the polysilicon island 20. The silicon nitride layer 22 is irradiated with a pulsed laser beam 200 heating it directly. The polysilicon island 20 is also heated by the laser causing indirect heating of the silicon nitride by heat conduction. This causes the hydrogen to diffuse from the silicon nitride layer 22 into the underlying polysilicon island 20. There are no intervening layers susceptible to heat damage over the silicon nitride layer 22 thus allowing a high laser fluence to be used. Also, the close proximity of the silicon nitride layer 22 with the polysilicon island 20 provides a short diffusion length for the hydrogen. Therefore, relatively few laser pulses of a high laser fluence are required to hydrogenate the polysilicon island 20 completely. These pulses are not sufficient to melt or deform the polymer substrate 12.

The hydrogenation process reduces the hydrogen content of the silicon nitride layer 22 located over the polysilicon island. Therefore, the hydrogen content of the region overlying the polysilicon island, indicated by "A" in FIG. 1d, is less than that of the region disposed laterally to one side of the semiconductor island, indicated by "B".

Figure 1E:
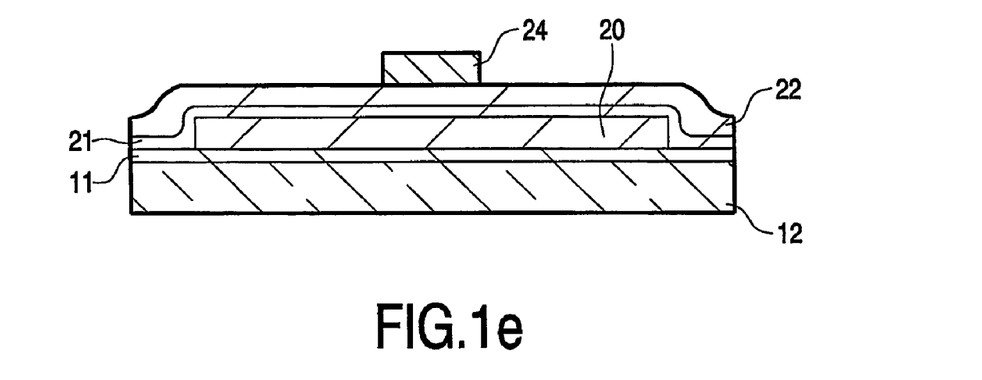

Following the hydrogenation, the silicon nitride layer remains in place to form the gate insulator layer. A gate electrode 24 is then formed over the polysilicon island by depositing and patterning a metal layer, as shown in FIG. 1e, to a thickness of 100-500 nm. It will be appreciated that the first set of address conductors is also formed during this step, each conductor extending across the substrate and connected to its respective row of gate electrodes. An insulating layer (not shown) is then deposited to provide insulation between the two crossing sets of address conductors.

Source and drain regions are then formed in the polysilicon island 20 by doping in a conventional manner using the gate electrode 24 as a mask. These regions are then irradiated with a laser to activate the dopants (not shown).

Figure 1F:
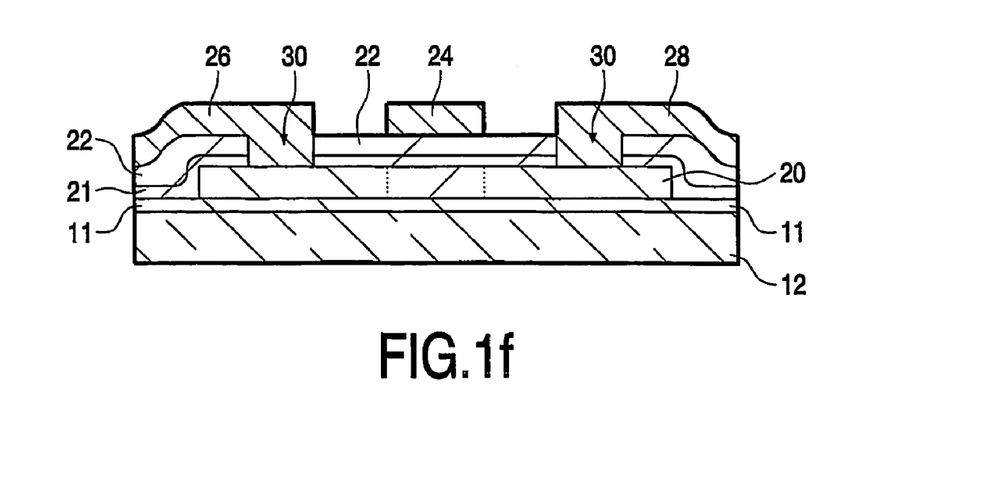

FIG. 1f shows the source and drain electrodes 26, 28 having been formed from the deposition and patterning of another metal layer. Each contacts, through vias 30 in the silicon nitride layer 22, with the polysilicon island 20 at the source and drain regions respectively. This completes the fabrication of the TFT.

Known methods are then employed to form the overlying layers which define the second set of address conductors and pixel electrodes connected to each TFT in the array to complete the active plate for the AMLCD. The metal electrodes, address conductors and connections thereto are typically formed from aluminium, for reflective type AMLCDs, ITO for transmissive-type AMLCDs, or any other conventionally used conducting material or combination thereof.

Figure 2A:
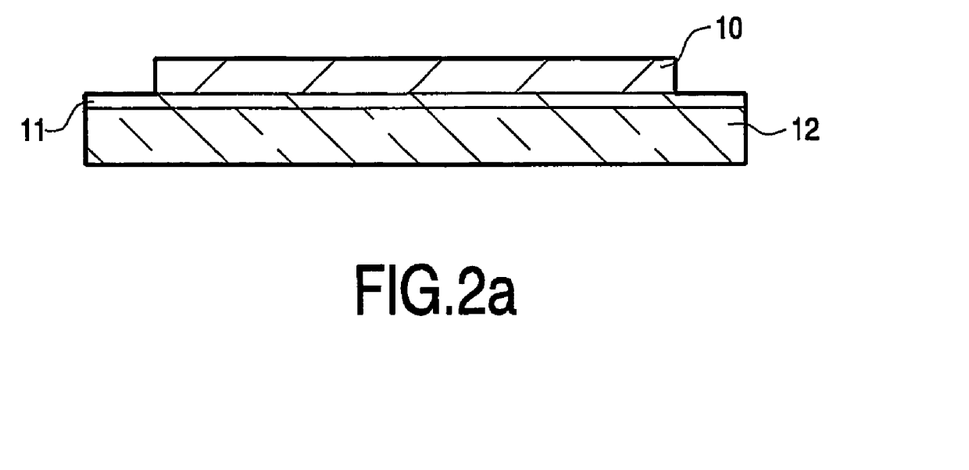
FIGS. 2a-2f show a cross-section of a TFT at various stages of manufacture according to a second embodiment of the invention.

An alternative method of manufacturing a top-gate TFT in accordance with the invention will now be described with reference to FIGS. 2a to 2f. An a-Si layer is deposited over a polymer substrate 12 (protected by a dielectric layer 11) in a similar way to the embodiment described above. The a-Si layer is then patterned by etching for example, as shown in FIG. 2a, to form a semiconductor island 10.

Figure 2B:
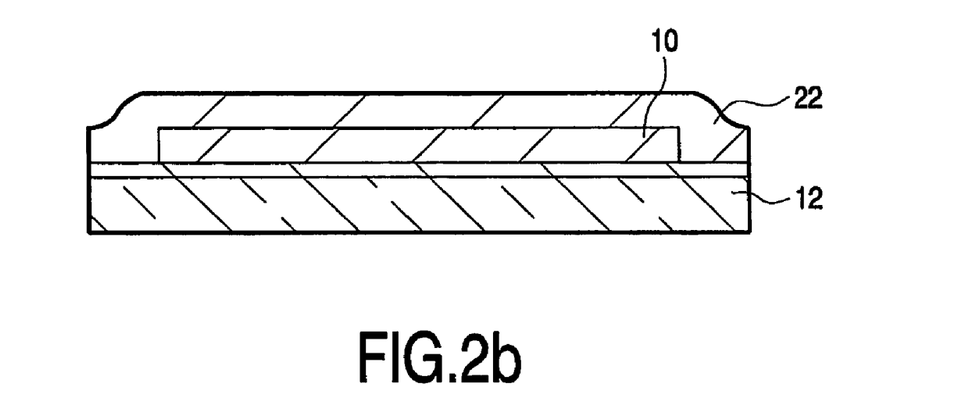

A hydrogen-rich silicon nitride layer 22 is then deposited over the entire substrate to a thickness of approximately 100-500 nm as shown in FIG. 2b. This provides a hydrogen-containing layer directly over the a-Si island.

Figure 2C:
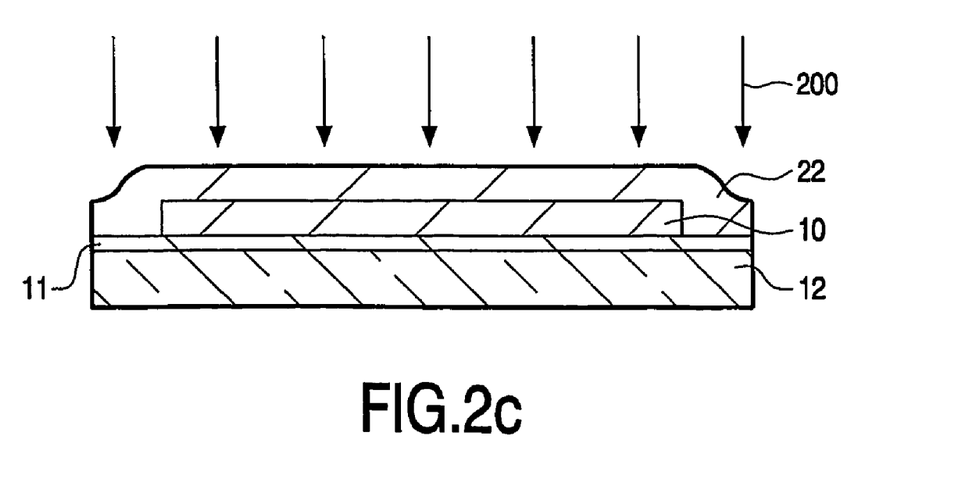

FIG. 2c shows the polycrystallisation and hydrogenation of the a-Si island 10 which processes are carried out in a single step. The overlying silicon nitride layer is irradiated with a laser beam 200 which indirectly heats the amorphous silicon island 10 to a sufficient temperature to anneal it. On cooling, the silicon island becomes polycrystalline. Also, the silicon is hydrogenated as hydrogen initially contained in the silicon nitride layer 22 directly overlying the island 10 diffuses into the adjacent polysilicon.

By annealing and hydrogenating the semiconductor layer in a single lasering step the overall manufacturing time and cost is reduced.

Figure 2D:
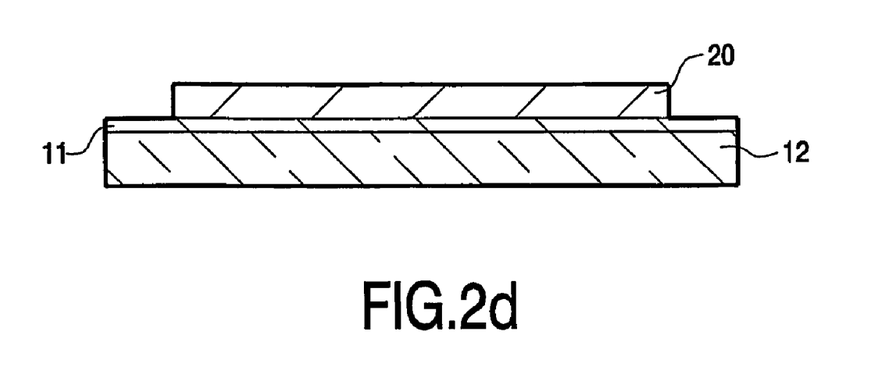
Figure 2E:
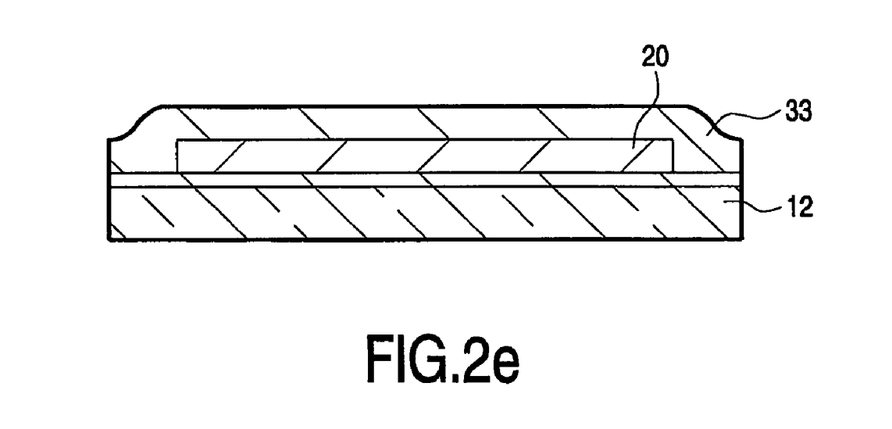
Figure 2F:
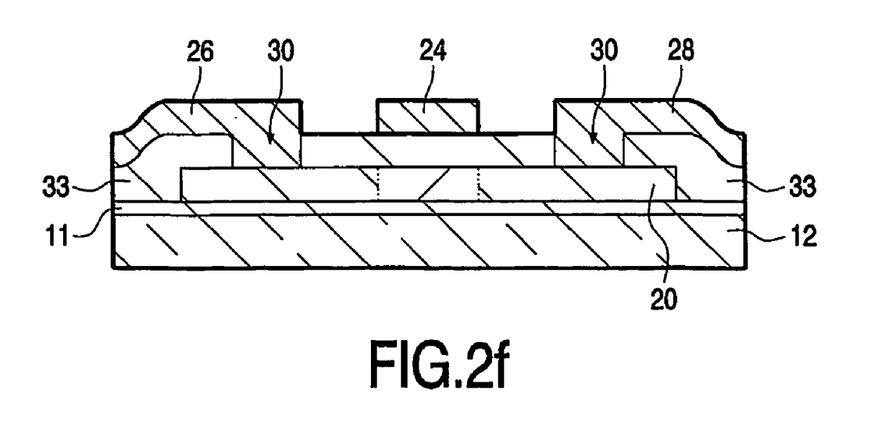

The silicon nitride layer 22 is then removed by wet or dry etching as shown in FIG. 2d leaving the hydrogenated polysilicon island 20. A layer of silicon dioxide 33 is then deposited over the entire substrate to a thickness of approximately 10-100 nm as shown in FIG. 2e. This provides a gate insulator layer between the polysilicon island 20 and the associated gate electrode in the fully constructed device.

Using a dry etch, content vias 30 are formed in the gate insulator layer 33 over the source and drain regions of the polysilicon islands 20. The gate, source and drain electrodes 24,26,28 for each TFT are then formed in a similar manner to the first embodiment described above and as shown in FIG. 2f.

Figure 3A:
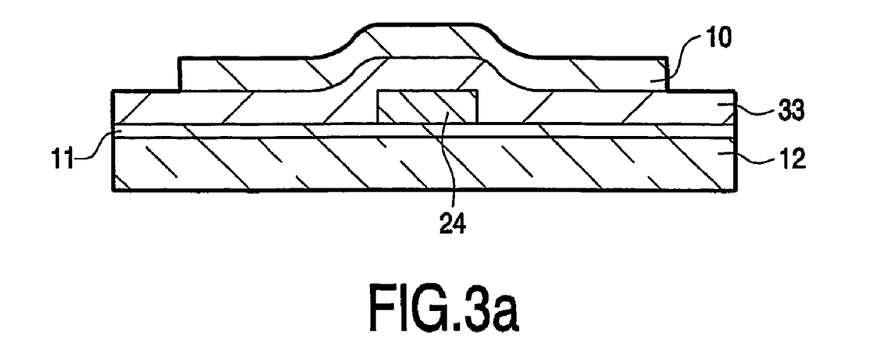
FIGS. 3a-3e show a cross-section of a TFT at various stages of manufacture according to a third embodiment of the invention.

The manufacture of a bottom gate TFT in accordance with the invention will now be described. With reference to FIG. 3a, a conductive layer is deposited over a polymer substrate 12 (protected by a dielectric layer 11) and patterned to form a gate electrode 24. It will be appreciated that all gate electrodes in the matrix array are formed in this step along with the associated row address conductors (not shown). A gate insulator layer is then formed of silicon dioxide 33 for example over the entire substrate to a thickness in the range of 10-100 nm. An a-Si layer is then deposited over the gate insulator layer and patterned to form a semiconductor island 10 over the gate electrode 24. The gate insulator layer 33 serves to electrically insulate the gate electrode 24 from the active island 10 in the final device.

Figure 3B:
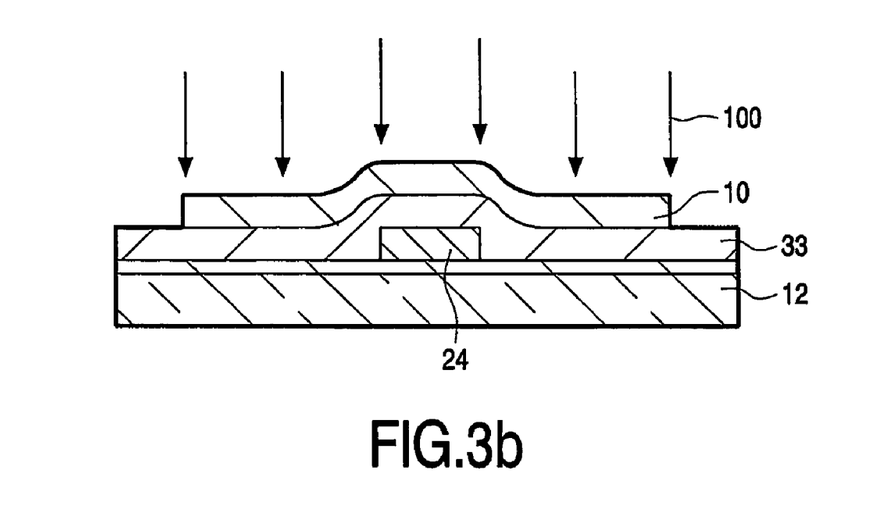

The a-Si island is then polycrystallised by irradiating the surface with a laser beam 100 as shown in FIG. 3b.

Figure 3C:
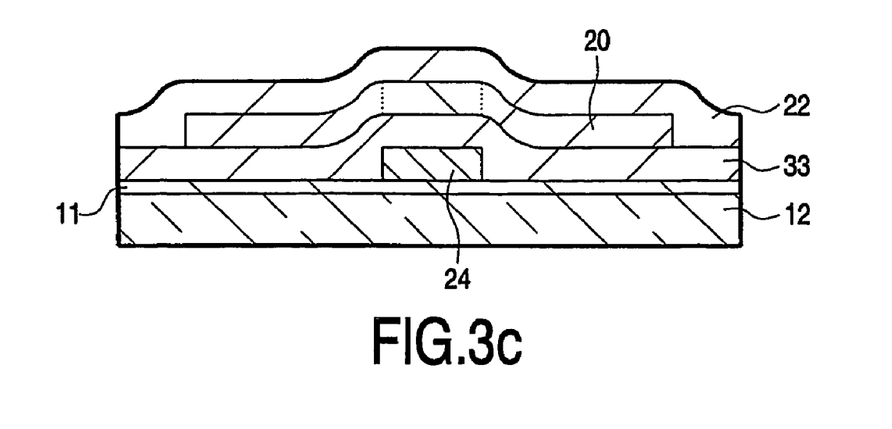

With reference to FIG. 3c, a layer of silicon nitride 22 is then deposited over the entire array. The silicon nitride 22 is rich in hydrogen and provides the hydrogen source for the hydrogenation of the polysilicon island 20. The hydrogenation is initiated by irradiating the top surface of the silicon nitride layer 22 with a pulsed laser beam. The heating of the device stack causes hydrogen to diffuse across the boundary between the silicon nitride layer 22 and the polysilicon island 20.

Figure 3D:
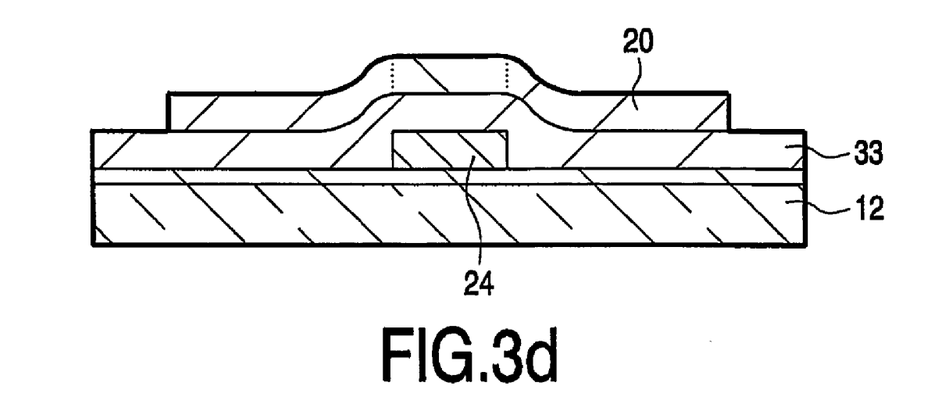

Following the hydrogenation, the silicon nitride layer 22 is removed with a dry etch as shown in FIG. 3d.

Figure 3E:
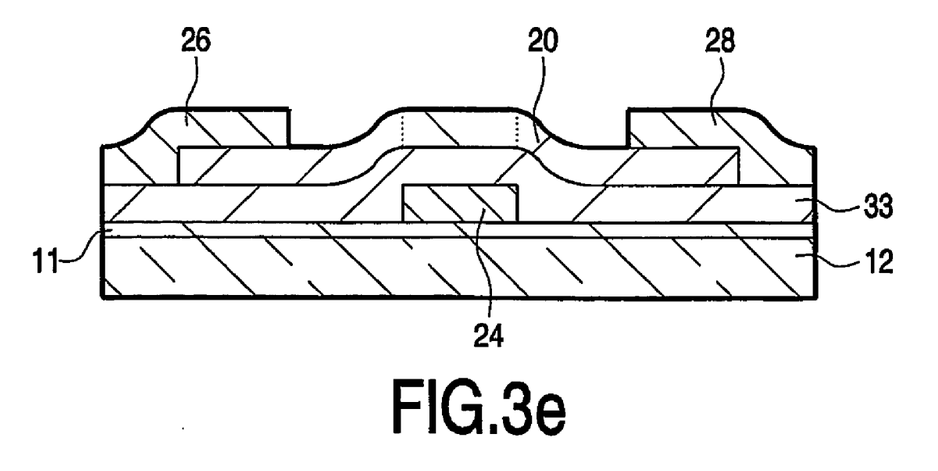

Source and drain electrodes 26,28 for each TFT are then formed by depositing and patterning a conductive layer of ITO for example as shown in FIG. 3e.

The hydrogenation and polycrystallisation lasering steps for this embodiment could alternatively be carried out as one simultaneous irradiation after the deposition of the silicon nitride layer 22, thus removing the requirement for the separate lasering step shown in FIG. 3b.

Another variation on the above embodiment leaves the silicon nitride layer 22 in place after the hydrogenation in order to passivate the surface of the polysilicon island 20. In this case, the source and drain electrodes contact the semiconductor through vias in the silicon nitride layer 22 (not shown).

Although the above embodiments have been described as having polysilicon active islands, it is envisaged that other semiconducting materials could be used. Likewise, materials other than silicon nitride can be used for the hydrogen-containing layer such as hydrogen-rich $SiO_2$ or SiON (silicon oxynitride).

The completed array of TFTs with connection thereto form part of the active plate for the AMLCD device.

Figure 4:
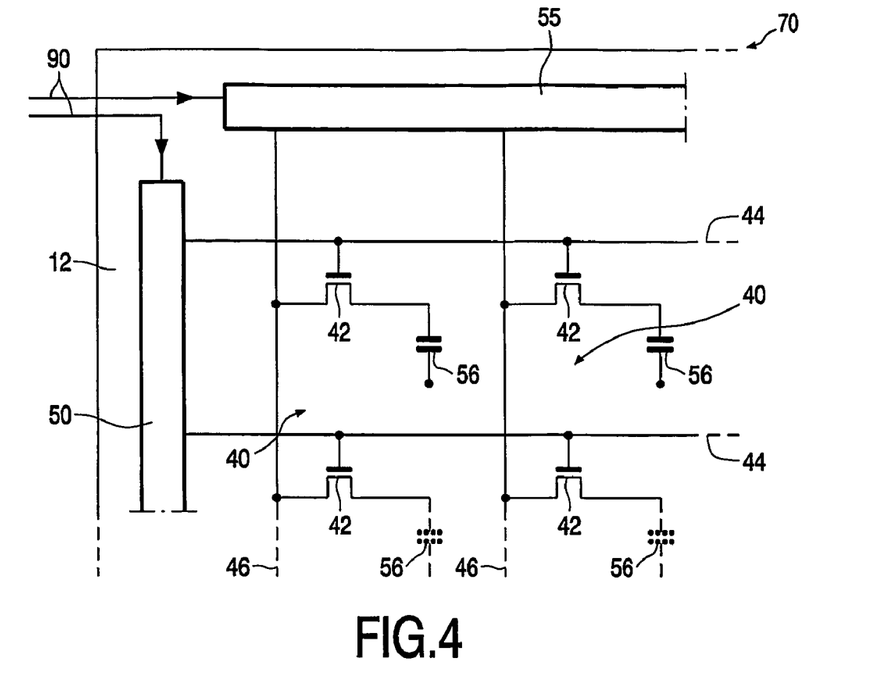
FIG. 4 shows part of an active matrix display device.
Figure 5:
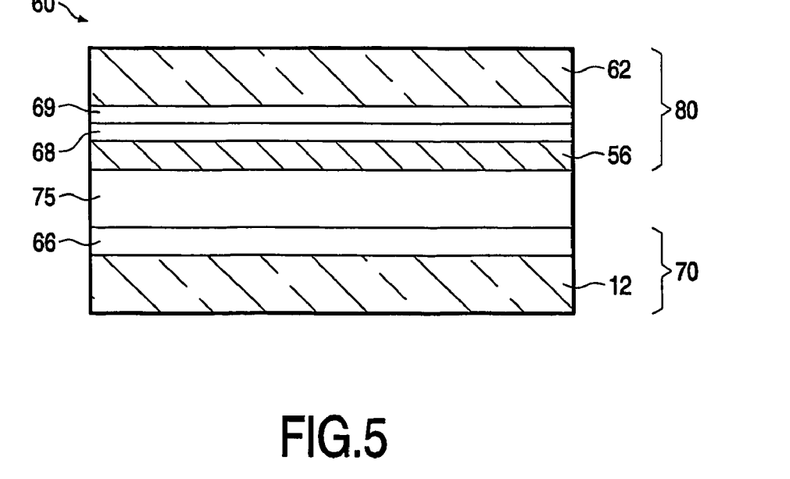
FIG. 5 shows a cross section of an active matrix liquid crystal display (AMLCD) device.

Referring to FIGS. 4 and 5, the active plate 70 comprises a row and column array of liquid crystal display elements 40. Only a few are shown here for simplicity but in practice there can be several hundred rows and columns of display elements. The display elements each have an associated TFT 42 acting as a switching device, and are addressed by row and column drive circuits 50 and 55 via sets of row and column address conductors 44 and 46 respectively. The drain of a TFT 42 is connected to a respective display element electrode 48 situated adjacent the intersection of respective row and column address conductors, while the gates of all the TFTs associated with a respective row of display elements 10 are connected to the same row address conductor 44. The sources of all the TFTs associated with a respective column of display elements are connected to the same column address conductor 46 The active matrix circuitry 66, including the sets of row and column address conductors 44, 46, the TFTs 42, and the picture element electrodes 48, is carried on the polymer substrate 12, altogether forming an active plate 70. A second insulating substrate 62 carries a continuous transparent electrode 56 common to all display elements in the array and together form a passive plate 80. This is arranged spaced from the polymer substrate 12 and the two substrates 12, 62 are sealed together around the periphery of the display element array and separated by spacers to define an enclosed space in which a layer of liquid crystal material 75 is contained. Each display element electrode 48 together with an overlying portion of the common electrode 56 and the liquid crystal material 75 therebetween defines a light modulation LC cell. The passive plate also comprises a polarising layer 68 and a colour filter layer 69 again carried on the second substrate 62.

Referring again to FIG. 4, the row and column drive circuits 50 and 55 are integrated onto the polymer substrate 12 and comprise, inter alia, TFTs formed at the same time and using the same processes as those forming the switching elements 42. During operation, video drive signals are supplied to the drive circuits 50,56 via connections 90 at the edge of the substrate 12.

With reference to FIG. 5, the AMLCD device 60 comprises the active plate 70 spaced from the passive plate 80.

The operation of this device follows conventional practice, for example as described in U.S. Pat. No. 5,130,829 by way of example only.

Although the embodiments described relate to AMLCD devices, the invention may equally apply to other electronic devices comprising a TFT, and in particular to any existing active matrix devices using polysilicon transistors. The invention may be applied to active matrix LED display devices, such as for example, the device described in EP-A-1116205, whose contents are incorporated herein as reference material, and other kinds of active matrix display devices, such as electrochromic, electrophoretic, and electroluminescent display devices. The invention may also be applied to optical image sensing array devices and capacitance type fingerprint sensing devices.

In summary therefore, the invention provides a method of manufacturing an electronic device comprising a thin film transistor, comprises forming a hydrogen-containing layer over a semiconductor layer, irradiating the hydrogen-containing layer so as to hydrogenate the semiconductor layer, and then forming electrodes over the semiconductor layer. A short diffusion length and direct path is provided for the hydrogen thus allowing rapid hydrogenation of the semiconductor layer using relatively few, high-fluence laser pulses. The supporting substrate is not heated significantly making the method particularly useful for TFTs on polymer substrates. Crystallisation and hydrogenation of the semiconductor layer can be executed in the same irradiation step.

From reading the present disclosure, other modifications will be apparent to persons skilled in the art. Such modifications may involve other features which are already known in the field of thin film transistors using compliant substrates and component parts therefor and which may be used instead of or in addition to features already described herein.

The invention claimed is:

1. The electronic device having a thin film transistor, the transistor having a gate electrode and source and drain electrodes, a semiconductor layer being separated from the gate electrode by a gate insulator layer, and the gate electrode being arranged to control current flow through a channel region of the semiconductor layer between the source and drain electrodes, wherein the electronic device is manufactured according to a method comprising the steps of:
    (a) forming the semiconductor layer over a substrate;
    (b) forming a hydrogen-containing layer over the semiconductor layer;
    (c) irradiating the hydrogen-containing layer with an energy beam to hydrogenate at least part of the semiconductor layer, wherein the hydrogen diffuses from the hydrogen-containing layer into the semiconductor layer; and then
    (d) forming the gate electrode over/under the semiconductor layer,
    wherein the gate insulator layer comprises the hydrogen-containing layer, the semiconductor layer has been patterned to form a semiconductor island, the gate insulator layer comprising a first region A overlying the semiconductor island and a second region B disposed laterally to one side of the semiconductor island, and the first region has a hydrogen content lower than that of the second region.

2. The electronic device according to claim 1, wherein the gate insulator layer further comprises a second insulating layer formed directly on the semiconductor layer.

3. A method of manufacturing an electronic device having a thin film transistor, the transistor having a gate electrode and source and drain electrodes, a semiconductor layer being separated from the gate electrode by a gate insulator layer, and the gate electrode being arranged to control current flow through a channel region of the semiconductor layer between the source and drain electrodes, the method comprising the steps of:
    (a) forming the semiconductor layer over a substrate;
    (b) forming a hydrogen-containing layer over the semiconductor layer;
    (c) irradiating the hydrogen-containing layer with an energy beam to hydrogenate at least part of the semiconductor layer; and then
    (d) forming at least one of the gate electrode and the source and drain electrodes over the semiconductor layer, wherein the gate insulator layer comprises the hydrogen-containing layer.

4. The method according to claim 3, further comprising the steps of:
    (g) forming at least one of the source electrode and drain electrode over the semiconductor layer, after step (d).

5. The method according to claim 4, further comprising the step of:
    (h) removing the hydrogen-containing layer.

6. The method according to claim 3, wherein the gate insulator layer further comprises a second insulating layer formed directly on the semiconductor layer.

7. The method according to claim 3, wherein said hydrogen-containing layer comprises silicon nitride.

8. The method according to claim 3, wherein the semiconductor layer initially comprises amorphous silicon, the method further comprising the step of:
    irradiating the semiconductor layer with an energy beam to polycrystallise at least part of the semiconductor layer, before step (c).

9. The method according to claim 3, wherein the semiconductor layer initially comprises amorphous silicon and the energy beam polycrystallises at least part of the semiconductor layer in step (c).

10. A method of manufacturing an electronic device having a thin film transistor, the transistor having a gate electrode and source and drain electrodes, a semiconductor layer separated from the gate electrode by a gate insulator layer, the gate electrode being arranged to control current flow through a channel region of the semiconductor layer between the source and drain electrodes, wherein the semiconductor layer initially comprises amorphous silicon, the method comprising the steps of:
    (a) forming the semiconductor layer over a substrate;
    (b) forming a hydrogen-containing layer over the semiconductor layer;
    (c) irradiating the hydrogen-containing layer with an energy beam to hydrogenate at least part of the semiconductor layer;
    (d) forming at least one of the gate electrode and the source and drain electrodes over the semiconductor layer; and
    (e) irradiating the semiconductor layer with another energy beam to polycrystallise at least part of the semiconductor layer before step (c).

11. The method according to claim 10, further comprising the step of:
    (h) forming at least one of the source electrode and drain electrode over the semiconductor layer, after step (d).

12. The method according to claim 11, further comprising the step of:
(i) removing the hydrogen-containing layer.

13. The method according to claim 10, wherein the gate electrode is formed in step (d) and the gate insulator layer comprises the hydrogen-containing layer and a second insulating layer formed directly on the semiconductor layer.

14. The method according to claim 10, wherein the gate electrode is formed in step (d), the method further comprising the steps of:

(f) removing the hydrogen-containing layer, and
(g) forming the gate insulator layer over the semiconductor layer, before step (d).

15. The method according to claim 10, wherein the semiconductor layer initially comprises amorphous silicon and the energy beam polycrystallises at least part of the semiconductor layer in step (c).

* * * * *